(12) United States Patent
Nam et al.

(10) Patent No.: US 8,649,281 B2
(45) Date of Patent: Feb. 11, 2014

(54) CONTROL DESIGN FOR BACKHAUL RELAY TO SUPPORT MULTIPLE HARQ PROCESSES

(75) Inventors: Young-Han Nam, Richardson, TX (US); Yan Wang, Plano, TX (US); Jianzhong Zhang, Irving, TX (US); Farooq Khan, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 536 days.

(21) Appl. No.: 12/756,080

(22) Filed: Apr. 7, 2010

(65) Prior Publication Data

US 2010/0275083 A1 Oct. 28, 2010

Related U.S. Application Data

(60) Provisional application No. 61/214,757, filed on Apr. 27, 2009.

(51) Int. Cl.
*G01R 31/08* (2006.01)

(52) U.S. Cl.
USPC .......................................... 370/252; 370/329

(58) Field of Classification Search
USPC ................. 370/252, 312, 315, 328, 329
See application file for complete search history.

(56) References Cited

U.S. PATENT DOCUMENTS

| | | | |
|---|---|---|---|
| 2006/0209870 A1 | 9/2006 | Lee et al. | |
| 2008/0165670 A1 | 7/2008 | Tao et al. | |
| 2008/0192718 A1 | 8/2008 | Jongren et al. | |
| 2008/0310338 A1 | 12/2008 | Charpenter et al. | |
| 2009/0074006 A1 | 3/2009 | Qi et al. | |
| 2010/0054358 A1* | 3/2010 | Ko et al. ..................... 375/267 |
| 2010/0195501 A1* | 8/2010 | Tynderfeldt et al. ........ 370/235 |
| 2011/0083066 A1* | 4/2011 | Chung et al. ............... 714/807 |
| 2011/0103336 A1* | 5/2011 | Ishii et al. .................. 370/329 |
| 2011/0292826 A1* | 12/2011 | Ahn et al. ................... 370/252 |
| 2012/0002593 A1* | 1/2012 | Kim et al. ................... 370/315 |
| 2012/0134316 A1* | 5/2012 | Seo et al. .................... 370/315 |

FOREIGN PATENT DOCUMENTS

| | | |
|---|---|---|
| JP | 2004104574 A | 4/2004 |
| RU | 2007 134339 A | 3/2009 |
| WO | WO 2008/128204 A1 | 10/2008 |
| WO | WO 2009/041029 A1 | 4/2009 |
| WO | WO 2009/041785 A2 | 4/2009 |
| WO | WO 2009/045011 A1 | 4/2009 |
| WO | WO 2009/045840 A2 | 4/2009 |

OTHER PUBLICATIONS

Decision on Grant from Russian Patent Office dated Jan. 10, 2013, in connection with Russian Application No. 2011148096/07(072148) 22 pages.
Translated Examination report dated Mar. 5, 2013, in connection with Japanese Application No. 2012-508396 9 pages.
TSG-RAN WG2 Meeting #55; Ericsson; "Semi persistent scheduling"; Seoul, Korea; Oct. 9-13, 2006; 5 pages.

* cited by examiner

*Primary Examiner* — Jung Park

(57) ABSTRACT

A wireless communication network includes a base station and a relay station. The relay station is configured to relay communications between the base station and at least one subscriber station. The base station is configured to communicate with the subscriber station via the relay station. The base station further is configured to transmit, in a subframe, a plurality of transport blocks for a plurality of Hybrid Automatic Repeat Request (HARQ) processes to the relay station. Each transport block corresponds to a different HARQ process.

32 Claims, 12 Drawing Sheets

CONTROL DESIGN FOR BACKHAUL RELAY TO SUPPORT MULTIPLE HARQ PROCESSES

CROSS-REFERENCE TO RELATED APPLICATION(S) AND CLAIM OF PRIORITY

The present application is related to U.S. Provisional Patent Application No. 61/214,757, filed Apr. 27, 2009, entitled "CONTROL DESIGN FOR BACKHAUL RELAY TO SUPPORT MULTIPLE HARQ PROCESSES". Provisional Patent Application No. 61/214,757 is assigned to the assignee of the present application and is hereby incorporated by reference into the present application as if fully set forth herein. The present application hereby claims priority under 35 U.S.C. §119(e) to U.S. Provisional Patent Application No. 61/214,757.

TECHNICAL FIELD OF THE INVENTION

The present application relates generally to wireless communications systems and, more specifically, to a system and method for relay node backhaul communications in a hybrid automatic repeat request system.

BACKGROUND OF THE INVENTION

Relay stations (hereinafter "RS") are added to wireless communication networks to increase the coverage range, user data rates, or both, at the periphery of the cellular coverage area. A multi-hop network facilities communication occurs between a base station (hereinafter "BS") and subscriber stations (also referred to as mobile stations, "MS") in the extended coverage area provided by a relay station. In a multi-hop network, a signal from a source may reach its destination in multiple hops through the use of the Relay stations. Relay stations typically boost the downlink (base station to the subscriber station) and uplink (subscriber station to the base station) signals regardless of whether the relay station is a fixed relay station (hereinafter "RS") or a mobile relay station. Current systems fail to effectively increase relay system coverage while employing power saving mechanisms for the relay station. Moreover, no procedures are currently available for effectively managing load conditions, such as the number of received and transmitted data and acknowledgment packets.

SUMMARY OF THE INVENTION

A base station capable of communicating with a subscriber station via a relay station is provided. The base station includes a plurality of antennas; and a transmitter coupled to the plurality of antennas. The transmitter is configured to transmit a plurality of transport blocks for a plurality of Hybrid Automatic Repeat Request (HARQ) processes. The plurality of transport blocks are transmitted in a subframe. Each transport block corresponds to a different HARQ process.

A base station capable of communicating with a subscriber station via a relay station is provided. The base station includes a plurality of antennas; and a transmitter coupled to the plurality of antennas. The transmitter is configured to a plurality of OFDM symbols in a plurality of resource blocks. The transmitter is also configured to semi statically configure a relay physical downlink control channel (R-PDCCH) region by higher layer signaling as two sets of OFDM symbols in a subframe, such that a first set of OFDM symbols is configured for downlink scheduling assignments and a second set of OFDM symbols is configured for uplink scheduling assignments.

A relay station is provided. The relay station includes a transceiver and a controller. The transceiver is configured to relay communications between a base station and at least one subscriber station. The controller is configured to receive, in a subframe, a plurality of transport blocks for a plurality of Hybrid Automatic Repeat Request (HARQ) processes to the relay station. Each transport block corresponds to a different HARQ process.

A relay station is provided. The relay station includes a transceiver and a controller. The transceiver is configured to receive and transmit communications between a base station and at least one subscriber station. The controller is configured to receive a plurality of OFDM symbols in a plurality of resource block. A relay physical downlink control channel (R-PDCCH) region is semi statically configured by higher layer signaling as two sets of OFDM symbols in a subframe, such that a first set of OFDM symbols is configured for downlink scheduling assignments and a second set of OFDM symbols is configured for uplink scheduling assignments.

A method for operating a base station is provided. The method includes transmitting, from the base station to a relay station, a plurality of transport blocks for a plurality of Hybrid Automatic Repeat Request (HARQ) processes to the relay station. The plurality of transport blocks are transmitted in a subframe and each transport block corresponds to a different HARQ process.

A method for operating a base station is provided. The method includes transmitting, from the base station to a relay station, a plurality of OFDM symbols in a plurality of resource blocks. The method also includes semi statically configuring a relay physical downlink control channel region as two sets of OFDM symbols in a subframe, such that a first set of OFDM symbols is configured for downlink scheduling assignments and a second set of OFDM symbols is configured for uplink scheduling assignments.

A method for operating a relay station is provided. The method includes receiving, from the base station, a plurality of transport blocks for a plurality of Hybrid Automatic Repeat Request (HARQ) processes. The plurality of transport blocks are received in a subframe and each transport block corresponds to a different HARQ process.

A method for operating a relay station is provided. The method includes receiving, from the base station, a plurality of OFDM symbols in a plurality of resource blocks. A relay physical downlink control channel (R-PDCCH) region is semi statically configured by higher layer signaling as two sets of OFDM symbols in a subframe, such that a first set of OFDM symbols is configured for downlink scheduling assignments and a second set of OFDM symbols is configured for uplink scheduling assignments.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1A through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

With regard to the following description, it is noted that the 3GPP Long Term Evolution (LTE) term "node B" and "eNodeB" are additional terms for "base station" used below. Also, the LTE term "user equipment" or "UE" is another term for "subscriber station" (SS) or "mobile station" (MS) used below. Further, the term "relay node" is another term for "relay station" (RS) used below.

FIG. 1 illustrates a cellular system that includes relay stations according to the disclosure. BS 102 transmits and receives data from relays, RS 105 and RS 110, and macro subscriber stations (SS), SS 111 and SS 116. RS 105 transmits and receives data from SS 112 and RS 110 transmits and receives data from SS 114. SS 111, SS 112, SS 114 and SS 116 can be similarly situated UE's such that each includes the same or substantially similar communication functionality. However, each of SS 111, SS 112, SS 114 and SS 116 can be a different type of UE, such as a personal data assistant, personal computer, mobile telephone, smart phone, and the like.

The transmission link between BS 102 and each relay, such as RS 105 and RS 110, is referred herein as a backhaul link 125. RS 110 forwards the received data from BS 102 to SS 114 and RS 105 forwards the received data from BS 102 to SS 112. RS 110 also forwards received data from SS 114 to BS 102 and RS 105 also forwards received data from SS 112 to BS 102.

The LTE system, described in 3GPP TS 36.321 v8.5.0, MAC Protocol Specification, the contents of which are incorporated by reference in their entirety, allows more than one transport blocks (TBs) per subframe transmission. When the physical layer is configured for spatial multiplexing, one or two TBs are expected per subframe and they are associated with the same Hybrid Automatic Repeat Request (HARQ) process.

Several downlink control information (DCI) formats are defined in 3GPP TS 36.212 v8.5.0, Multiplexing and Channel Coding, the contents of which are incorporated by reference in their entirety. Additionally, interleaving, for use with mapping resource elements as disclosed in 6.8.5 of "3GPP TS 36.321 v8.5.0, MAC Protocol Specification," is described 3GPP TS 36.213 v8.5.0, Physical Layer Procedure, the contents of which are incorporated by reference in their entirety.

According to the LTE specification described in "3GPP TS 36.321 v8.5.0, MAC Protocol Specification," only one DCI can be received and decoded for a physical downlink shared channel (PDSCH) transmission.

Figure 1B:
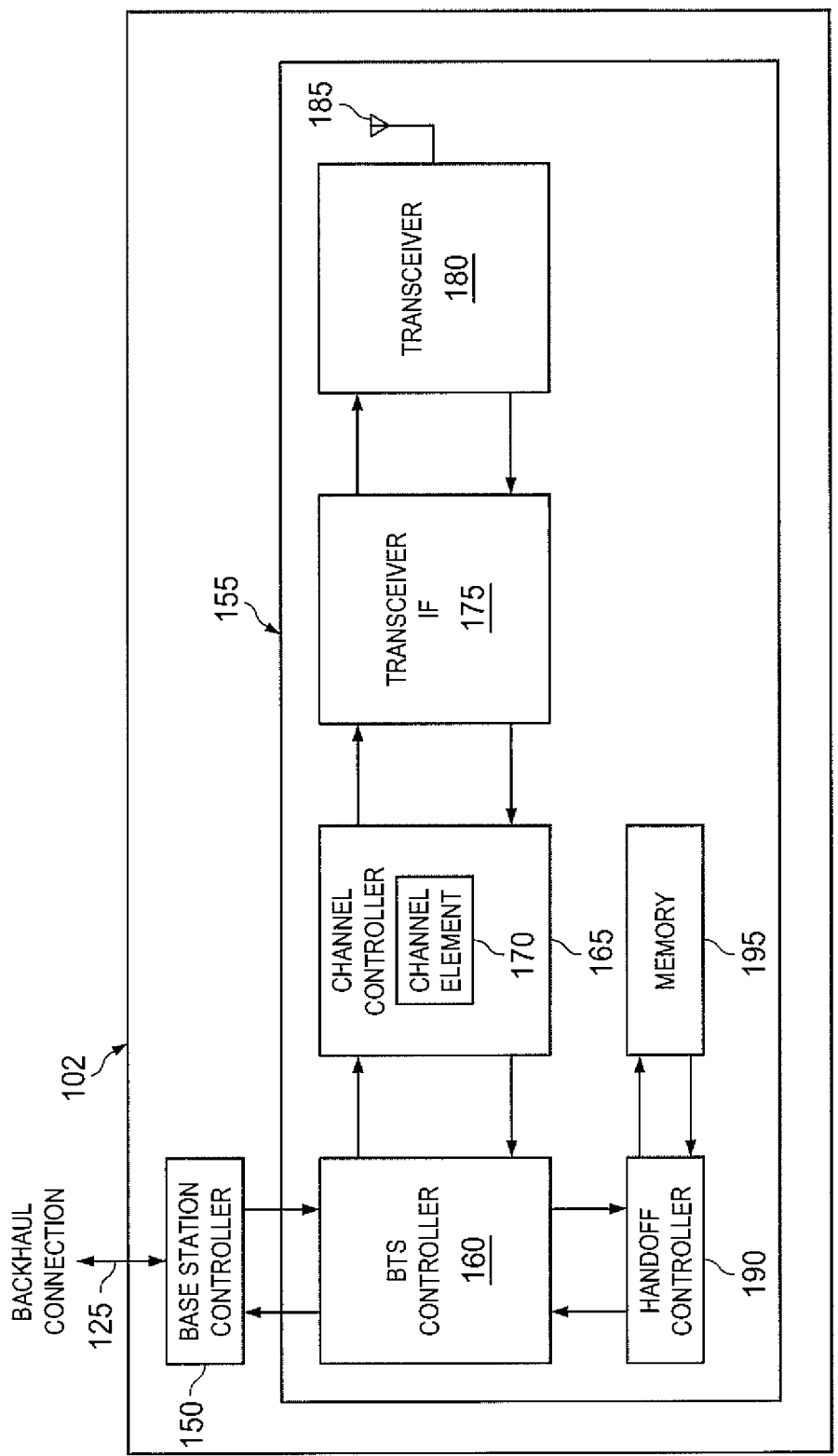
FIG. 1B illustrates an exemplary base station in greater detail according to one embodiment of the present disclosure.

FIG. 1B illustrates an exemplary base station in greater detail according to one embodiment of the present disclosure. The embodiment of base station 102 illustrated in FIG. 1B is for illustration only. Other embodiments of the base station 102 could be used without departing from the scope of this disclosure.

Base station 102 comprises base station controller (BSC) 150 and base transceiver subsystem (BTS) 155. A base station controller is a device that manages wireless communications resources, including the base transceiver subsystems, for specified cells within a wireless communications network. A base transceiver subsystem comprises the RF transceivers, antennas, and other electrical equipment located in each cell site. This equipment may include air conditioning units, heating units, electrical supplies, telephone line interfaces and RF transmitters and RF receivers. For the purpose of simplicity and clarity in explaining the operation of the present disclosure, the base transceiver subsystems in cell 122 and the base station controller associated with the base transceiver subsystem are collectively represented by BS 102.

BSC 150 manages the resources in cell site 121, including BTS 155. BTS 155 comprises BTS controller 160, channel controller 165, transceiver interface (IF) 175, two RF transceiver units 180, and antenna array 185. Channel controller 165 comprises a plurality of channel elements, including exemplary channel element 170. BTS 155 also comprises a handoff controller 190. The embodiment of handoff controller 190 and memory 195 included within BTS 155 is for illustration only. Handoff controller 190 and memory 195 can be located in other portions of BS 102 without departing from the scope of this disclosure.

BTS controller 160 comprises processing circuitry and memory capable of executing an operating program that communicates with BSC 150 and controls the overall operation of BTS 155. Under normal conditions, BTS controller 160 directs the operation of channel controller 165, which contains a number of channel elements, including channel element 170, that perform bi-directional communications in the forward channels and the reverse channels. A forward channel refers to a channel in which signals are transmitted from the base station to the mobile station (also referred to as DOWNLINK communications). A reverse channel refers to a channel in which signals are transmitted from the mobile station to the base station (also referred to as UPLINK communications). In an advantageous embodiment of the present disclosure, the channel elements communicate according to an OFDMA protocol with the mobile stations in cell 120. Transceiver IF 175 transfers the bi-directional channel signals between channel controller 170 and RF transceiver unit 180. The embodiment of RF transceiver units 180 as a single device is for illustration only. Each RF transceiver unit 180 can include separate transmitter and receiver devices without departing from the scope of this disclosure.

Antenna array 185 transmits forward channel signals received from RF transceiver unit 180 to mobile stations in the coverage area of BS 102. Antenna array 185 also sends to transceiver 180 reverse channel signals received from mobile stations in the coverage area of BS 102. In some embodiments of the present disclosure, antenna array 185 is a multi-sector antenna, such as a three-sector antenna in which each antenna sector is responsible for transmitting and receiving in a 120° arc of coverage area. Additionally, RF transceiver 180 may contain an antenna selection unit to select among different antennas in antenna array 185 during transmit and receive operations.

According to some embodiments of the present disclosure, BTS controller 160 is operable to store threshold parameters in a memory 195. Memory 195 can be any computer readable medium, for example, the memory 195 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. Memory 195 comprises a random access memory (RAM) and another part of memory 195 comprises a Flash memory, which acts as a read-only memory (ROM).

BSC 150 is operable to maintain communications between RS 105 and RS 110. BS 102 communicates to RS 105 and RS 110 via the backhaul link 125. In some embodiments, the backhaul link 125 is wire-line connection. In some embodiments, the backhaul link 125 is wireless connection.

Figure 1C:
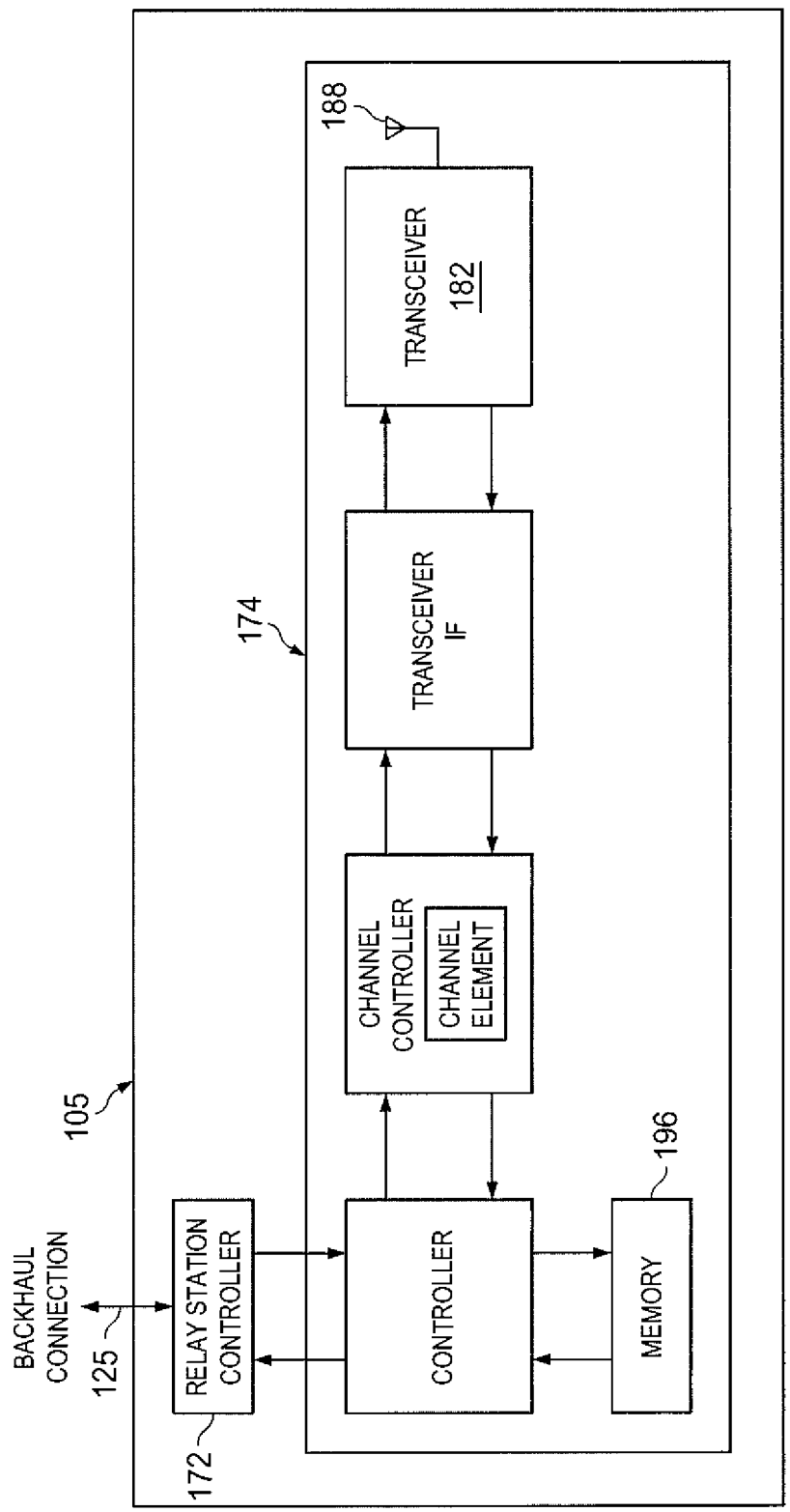
FIG. 1C illustrates an exemplary relay station in greater detail according to one embodiment of the present disclosure.

FIG. 1C illustrates an exemplary relay station in greater detail according to one embodiment of the present disclosure. The embodiment of relay station 105 illustrated in FIG. 1C is for illustration only. Other embodiments of the relay station 105 could be used without departing from the scope of this disclosure.

Relay station (RS) 105 can include the same or similar components as BS 102. For example, RS 105 includes a relay station controller (RSC) 172 and transceiver subsystem (BTS) 174. RS 105 further includes a memory 196 and antenna array 188. For the purpose of simplicity and clarity in explaining the operation of the present disclosure, the base transceiver subsystems in cell 135 and cell 140 and the relay station controller associated with the relay transceiver subsystems are collectively represented by RS 105 and RS 110 respectively.

Antenna array 188 transmits forward channel signals received from RF transceiver unit 182 to mobile stations in the coverage area of RS 105. Antenna array 188 also sends to transceiver 174 reverse channel signals received from mobile stations in the coverage area of RS 105 (such as cell 135). In some embodiments of the present disclosure, antenna array 188 is a multi-sector antenna, such as a three-sector antenna in which each antenna sector is responsible for transmitting and receiving in a 120° arc of coverage area. Additionally, RF transceiver 182 may contain an antenna selection unit to select among different antennas in antenna array 188 during transmit and receive operations.

Memory 196 can be any computer readable medium, for example, the memory 196 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. Memory 196 comprises a random access memory (RAM) and another part of memory 196 comprises a Flash memory, which acts as a read-only memory (ROM).

RSC 172 is operable to maintain communications between BS 102 and RS 105 and between SS 112 and RS 105. RS 105 communicates to SS 112 via a wireless connection. In some embodiments, RS 105 communicates to BS 102 via the backhaul link 125 connection. In some embodiments, RS 105 communicates to BS 102 via a wireless connection.

Figure 2:
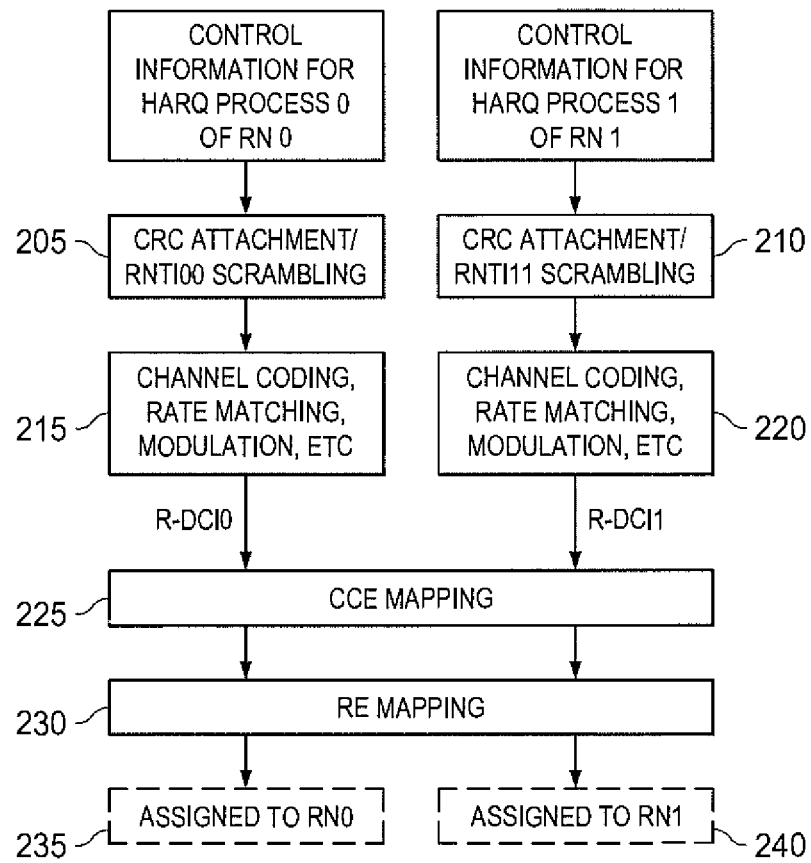
FIG. 2 illustrates separate coding according to this disclosure.

FIG. 2 illustrates separate coding according to this disclosure. In the example illustrated in FIG. 2, two relay stations (RS) and two HARQ processes exist in the system. For Frequency Division Duplexing (FDD), a maximum of eight HARQ processes exist in the downlink. Two DCIs are transmitted to two relay stations. The DCI are separately coded such that a first DCI is sent to a first RS, such as RS 105, and a second DCI is sent to a second RS, such as RS 110. Each relay station, RS 105 and RS 110, include a different radio network temporary identifier (RNTI). CRC is scrambling, using the respective RNTI for each relay station, is performed on each respective DCI. For example, in block 205, the CRC attachment for the first DCI is scrambled using RNTI00, which is the RNTI corresponding to RS 105. Additionally, in block 210, the CRC attachment for the second DCI is scrambled using RNTI11, which is the RNTI corresponding to RS 110. The scrambled DCI undergoes channel coding, rate matching and modulation in blocks 215, 220; CCE mapping in block 225 and resource element mapping in block 230. Thereafter, RS 105 and RS 110 each determine its respective DCI in blocks 235 and 240. Since each relay station knows its own RNTI, RS 105 and RS 110 can decode the DCI using their respective RNTI.

For an in-band backhaul relay, the BS-to-relay link operates in the same frequency spectrum as the relay-to-UE link. Due to the relay transmitter causing interference to its own receiver, simultaneous BS-to-relay and relay-to-UE transmissions on the same frequency resource may not be feasible unless sufficient isolation of the outgoing and incoming signals is provided, such as by means of specific, well separated and well isolated antenna structures. Similarly, at the relay, such as RS 110, it may not be possible to receive SS 114 transmissions simultaneously while RS 110 is transmitting to BS 102.

One possibility to handle the interference problem is to operate RS 110 such that RS 110 is not transmitting to terminals when it is supposed to receive data from BS 102 (e.g., the donor BS), that is, to create "gaps" in the relay-to-UE transmission. These "gaps", during which terminals (including Rel-8 terminals) are not supposed to expect any relay transmission, can be created by configuring multicast/broadcast single frequency network (MBSFN) subframes as illustrated in FIG. 3.

Figure 3:
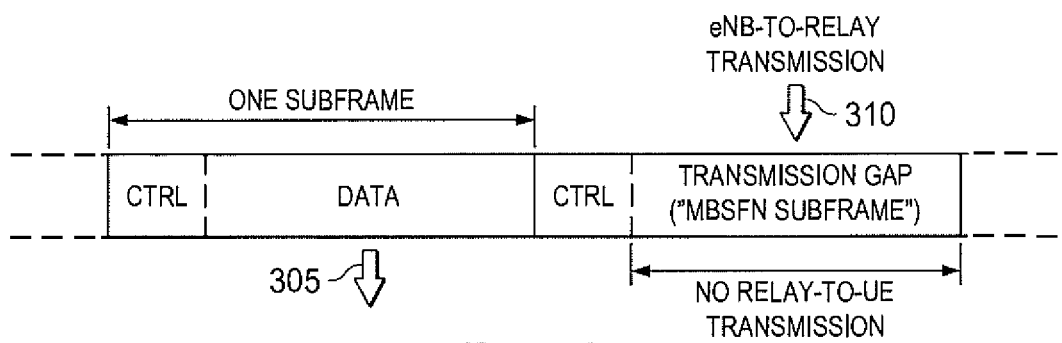
FIG. 3 illustrates a relay-to-UE communication and a BS-to-relay communication according to this disclosure.

FIG. 3 illustrates a relay-to-UE communication and a BS-to-relay communication according to this disclosure. The relay-to-UE communication 305 uses normal subframes and the BS-to-relay communication 310 uses MBSFN subframes. According to 3GPP TR 36.814 v1.0.1, Further Advancements for E-UTRA Physical Layer Aspects, the contents of which are incorporated by reference in their entirety, Relay-to-BS transmissions can be facilitated by not allowing any terminal-to-relay transmissions in some subframes.

Figure 4:
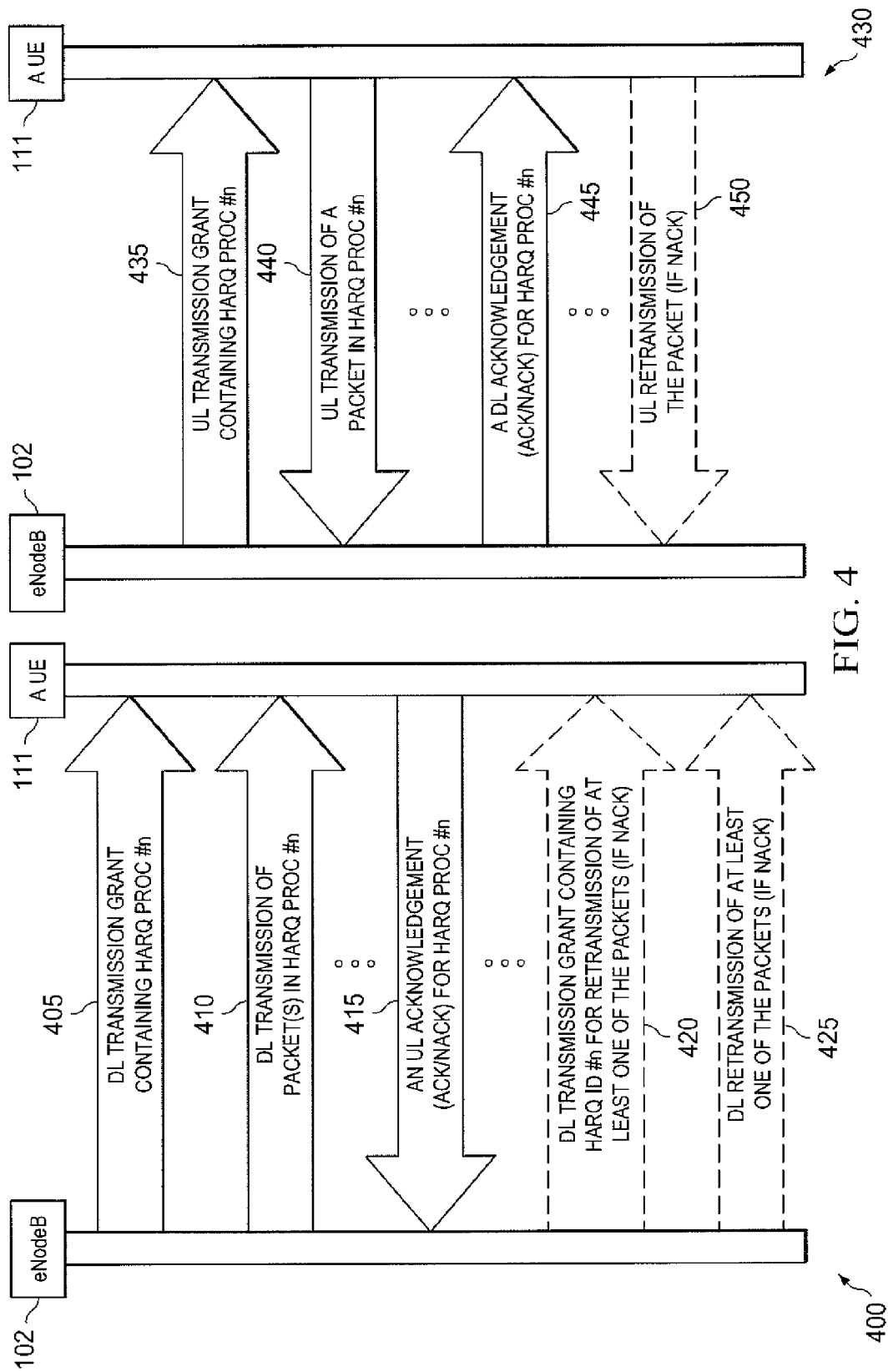
FIG. 4 illustrates a signal exchange between a base station and subscriber station according to this disclosure.

FIG. 4 illustrates a signal exchange between a base station and subscriber station according to this disclosure. BS 102 and SS 114 can exchange physical signals associated with an HARQ process.

For DL transmission 400 to a UE, BS 102 transmits a DL transmission grant 405 to SS 111 containing HARQ ID number #n in a subframe. In the same subframe, BS 102 also transmits up to two packets (or TBs) 410 for the HARQ process to SS 111. Four subframes later, SS 111 sends an acknowledgement 415 of the packets in HARQ process #n back to BS 102. The acknowledgement 415 signal contains up to two bits for the two packets, and each bit indicates the decoding result at SS 111. If SS 111 successfully decodes a packet, the acknowledgement 415 signal will include an ACK bit for the packet; otherwise the acknowledgement 415 signal will include a NACK bit for the packet. If a NACK is received for a packet, BS 102 sends a transmission grant 420 containing HARQ ID #n and a retransmission packet 425 for the HARQ process to SS 111 a few subframes later than the subframe in which SS 111 has received the NACK.

For UL transmission 430 to a UE, BS 102 transmits a UL transmission grant 435 to SS 111. The UL transmission grant 435 includes a HARQ ID number #n in a subframe. Four subframes later, SS 111 transmits a packet 440 for the HARQ process to BS 102. Four subframes later, BS 102 sends an acknowledgement 445 signal of the packet in HARQ process #n back to SS 111. If BS 102 successfully decodes the packet, BS 102 sends back an ACK; otherwise BS 102 sends back a NACK to SS 111. If a NACK is received, SS 111 retransmits the packet 450 for the HARQ process to BS 102 in four subframes later than the subframe in which SS 111 has received a NACK in the ACK 445 signal.

Figure 5:
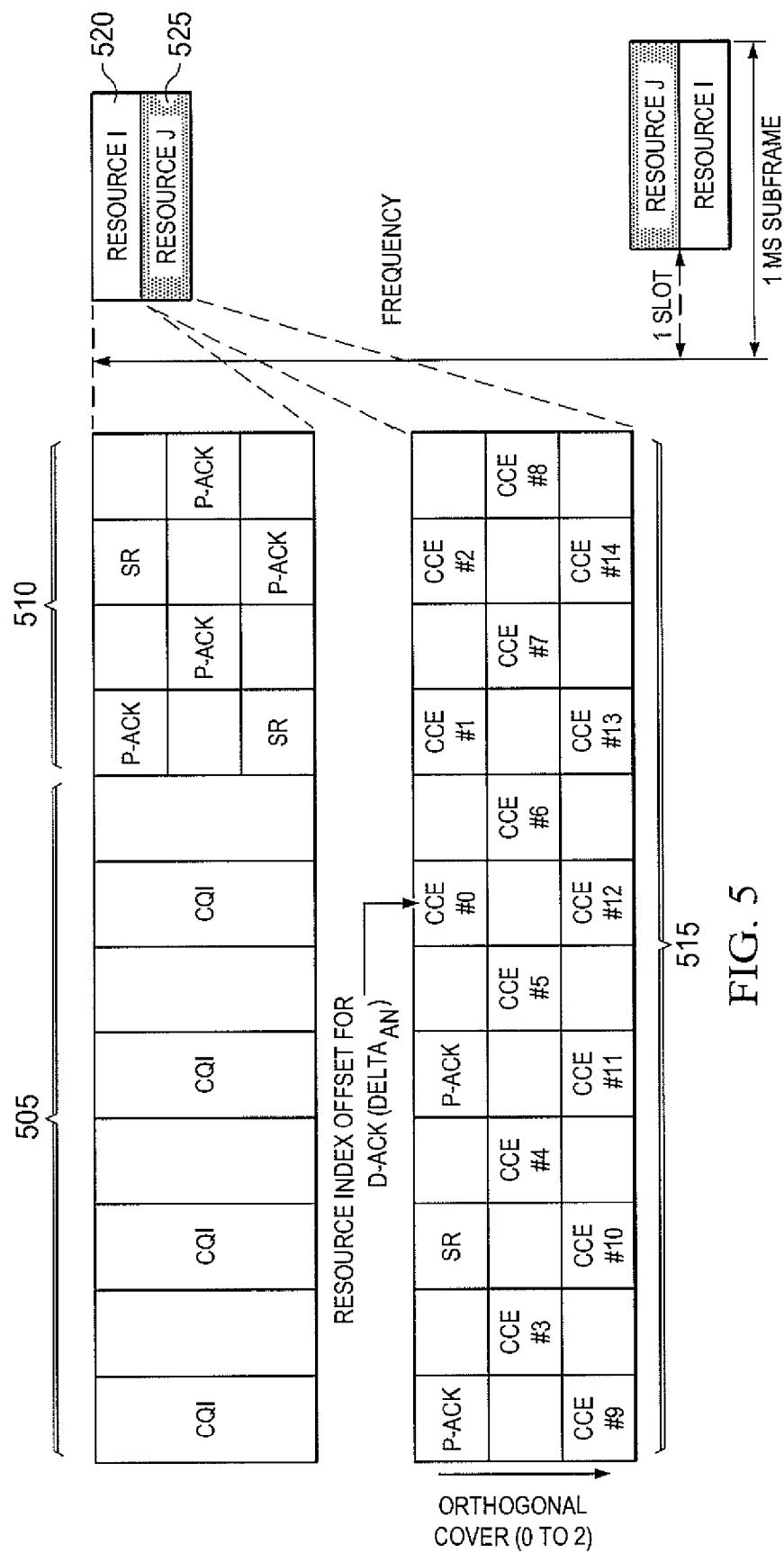
FIG. 5 illustrates a Physical Uplink Control Channel according to this disclosure.

FIG. 5 illustrates a Physical Uplink Control Channel according to this disclosure. The Physical Uplink Control Channel (PUCCH) is divided into multiple regions: CQI region 505, persistent-ACK/NACK (P-ACK) and scheduling request (SR) region, hereinafter "P-ACK/SR region" 510, and dynamic ACK/NACK (D-ACK) region 515. In the LTE system, an UL ACK/NACK is mapped to PUCCH following the procedure according to 5.4.1 in 3GPP TS 36.321 v8.5.0, MAC Protocol Specification. The CQI region 505 and P-ACK/SR region 510, can be included in a first resource 'i' 520 while the D-ACK region 515 can be included in a second resource 'j' 525.

RS 105 has fewer opportunities to receive data from BS 102 (the anchor eNB). When RS 105 is allowed to receive backhaul data, RS 105 still needs to share the resource with other relay stations, such as RS 110 and macro-cell subscriber stations (subscriber stations that are connected to anchor BS 102 directly), such as SS 111 and SS 116. In order to send more backhaul data from BS 102 to RS 105 with less transmission opportunities, embodiments of the present disclosure provide control designs for downlink backhaul traffic such that RS 102 can receive multiple HARQ processes in a subframe.

RS 105 can receive multiple transport blocks within the same subframe. The multiple transport blocks can be received in the same subframe regardless of whether the system is a multiple input multiple output (MIMO) system or not. For example, in a non-MIMO system, RS 105 can receive multiple transport blocks received on one antenna using two different time division resources, that is, two different sets of resource blocks.

In some embodiments, BS 102 sends at least one transmission grant to RS 105 that specifies a number of sets of resource blocks (such as, one set, two sets, and so forth) assigned for RS 105 in a subframe, where a set of resource blocks is assigned for one HARQ process for RS 105. Furthermore, each HARQ process for RS 105 has a process ID number, and a HARQ process carries a number of transport blocks (such as, one transport block, two transport blocks, and so forth). For example, each TB has a corresponding HARQ process ID. That is, if two transport blocks are to be sent on the subframe, two separate HARQ process IDs are utilized.

For example, one or more transmission grants are sent to RS 105 for indicating the time-frequency resources (or resource blocks, RBs) for BS 102 to relay transmission, or backhaul downlink (DL) transmission. In another example, one or more transmission grants are sent to RS 105 for indicating the time-frequency resources (or RBs) the relay-to-eNodeB transmission, or backhaul uplink (UL) transmission.

In a first method, BS 102 can multiplex the transmission grants for relays, such as RS 105 and RS 110, and macro subscriber stations, such as SS 111 and SS 116, in the same subframe. In another method, BS 102 sends transmission grants for relays, such as RS 105 and RS 110, and macro subscriber stations, such as SS 111 and SS 116, in different subframes.

The transmission grants are carried in a physical channel. In one method, the grants relays, such as RS 105 and RS 110, are sent in physical downlink control channel (PDCCH) defined in 3GPP Rel-8 system. In another method, the DL grants relays, such as RS 105 and RS 110, are sent in R-PDCCH whose time-frequency resources are separately allocated in a subframe from the resources for 3GPP Rel-8 PDCCH.

Figure 6:
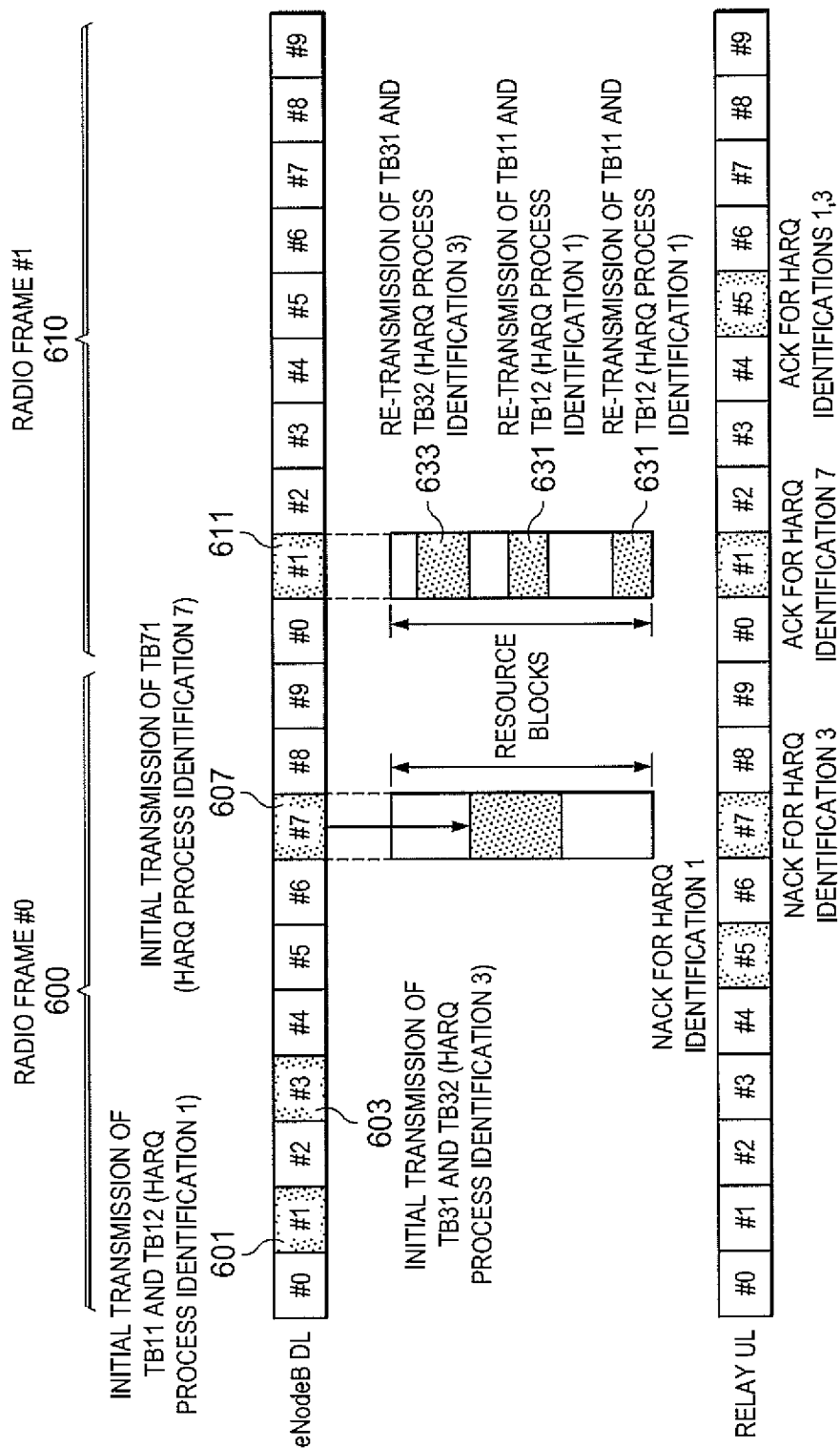
FIG. 6 illustrates transmissions for HARQ processes for a relay station according to embodiments of the present disclosure.

FIG. 6 illustrates transmissions for HARQ processes for a relay station according to embodiments of the present disclosure. The embodiment of the transmissions shown in FIG. 6 is for illustration only. Other embodiments could be used without departing from the scope of this disclosure.

The transmissions between BS 102 and RS 105 are for a number of HARQ processes. The transmissions can be a single transmission, a dual transmission, multiple single transmissions, multiple dual transmissions, or a combination of single and dual transmissions. In a single transmission, one or more transport blocks are transmitted in a contiguous set (that is one or more resources blocks) of resource blocks in the subframe. In a dual transmission, one or more transport blocks are transmitted in two or more non-contiguous resource blocks in the subframe.

For example, in subframe #1 601 in radio frame #0 600, BS 102 transmits TB11 and TB12, which include a HARQ process ID of "1", to RS 105; in subframe #1 611 in radio frame #0 610, BS 102 transmits TB31 and TB32, which include a HARQ process ID of "3", to RS 105; and in subframe #7 607 in radio frame #0 600, BS 102 transmits TB71 617, which include HARQ process ID of "7" to RS 105. TB71 617 can be a single transmission across multiple resource blocks in subframe #7 607.

RS 105 feeds back the ACK/NACK bits associated with these HARQ processes to BS 102 in relay UL 620, according to the decoding results. When RS 105 successfully decodes the TBs transmitted in a subframe, RS 105 feeds back an ACK to BS 102 four subframes later; otherwise, RS 105 feeds back a NACK to BS 102. In the illustrated example, RS 105 fails to decode the TBs associated with HARQ IDs "1" and "3", while RS 105 successfully decodes the TB associated with HARQ ID "7". Therefore, RS 105 transmits a NACK 621 for HARQ ID "1" in subframe #5 645, a NACK 623 for HARQ ID "3" in subframe #7 647, and an ACK 627 for HARQ ID "7" in subframe #1 651 in the second radio frame.

For the TBs not successfully decoded at RS 105, BS 102 schedules retransmissions in later subframes than the subframes that BS 102 receives the ACK/NACK feedback. In the example, BS 102 schedules retransmissions 631 and 633 for the TBs carried in HARQ processes "1" and "3" in subframe #1 611 in radio frame #1 615. For example TB31 and TB32 can be transmitted in a single retransmission 633 across multiple resource blocks in subframe #1 611. Additionally, TB31 and TB32 also can be transmitted a dual retransmission 631 across multiple resource blocks in subframe #1 611. Thereafter, RS 105 can transmit an ACK 629 for HARQ IDs "1" and "3" in subframe #5 655 in the second radio frame.

In some embodiments, BS 102 indicates to RS 105 how many HARQ process are transmitted to RS 105. When RS 105 receives the indication, RS 105 will know how many HARQ processes are transmitted. RS 105 can decode the control information accordingly. In some embodiments, the single and dual transmissions can be separately encoded such that the retransmission 633 for TB31 and TB32 can be encoded in a first downlink grant and the retransmissions 631 for TB11 and TB12 can be encoded in a second downlink grant. In some embodiments retransmissions 633 and 631 are encoded in the same downlink grant.

Figure 7:
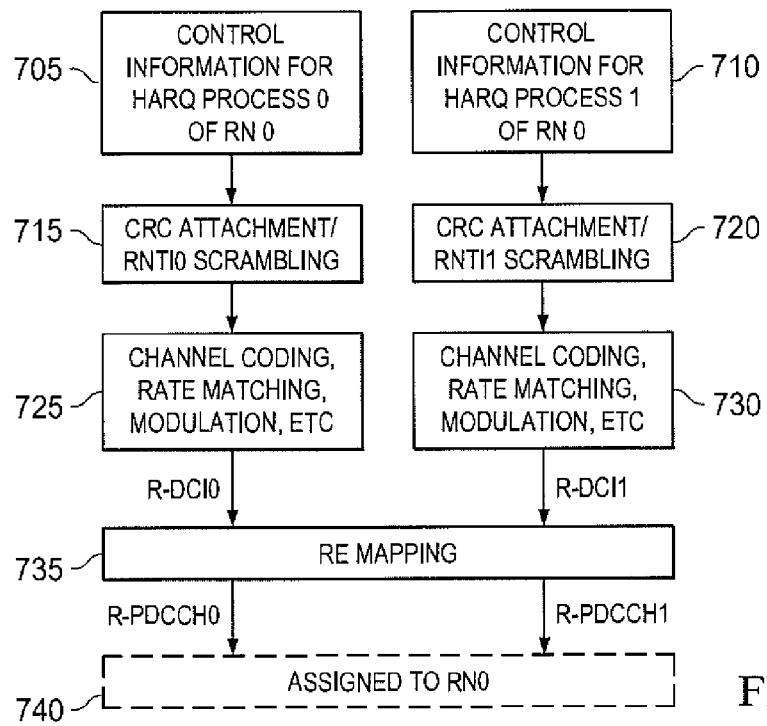
FIG. 7 illustrates two HARQ process assigned to one relay station with two RNTIs according to embodiments of the present disclosure.

FIG. 7 illustrates two HARQ process assigned to one relay station with two RNTIs according to embodiments of the present disclosure. The embodiment shown in FIG. 7 is for illustration only. Other embodiments could be used without departing from the scope of this disclosure.

In some embodiments, separate Relay-PDCCHs (R-PDCCHs) are used to transmit multiple HARQ processes control information to one RN, such as RS 105, in a subframe. Each R-PDCCH corresponds to a DCI for one HARQ process. RS 105 can decode each DCI independently. From each R-PDCCH, RS 105 can receive (e.g., determine) the control information for each HARQ process. The control information includes at least one of the fields in one of the DCI formats in 3GPP LTE 36.212 v8.5.0, Multiplexing and Channel Coding.

In some embodiments, multiple RNTIs are assigned for multiple HARQ processes. A HARQ process is linked to an RNTI, such as a UE ID or a MAC ID, and a DCI for the HARQ process will have an attachment of a scrambled CRC with the RNTI. In this case, a DCI format does not contain the HARQ process number.

RS 105 can find out the HARQ process number by decoding a DCI, such as by de-scrambling the CRC attachment to the DCI using the RNTI. For example, RNTI0 is associated with HARQ process "0", while RNTI1 is associated with HARQ process "1". Further, RNTI0 and RNTI1 correspond to RS 105. That is, RS 105 includes RNTI0 and RNTI1 as IDs for RS 105. When a subscriber station, such as SS 112, decodes a DCI with RNTI0, SS 112 determines that the DCI is for HARQ process "0". Alternatively, when SS 112, decodes a DCI with RNTI1, SS 112 determines that the DCI is for HARQ process "1".

For example, block 705 includes control information for HARQ Process "0" for RS 105 and block 710 includes control information for HARQ Process "1" for RS 105. In block 715, a cyclic redundancy check (CRC) attachment and scrambling is performed using RNTI0. In block 720, a CRC attachment and scrambling is performed using RNTI1. Both RNTI0 and RNTI1 correspond to RS 105. In blocks 725 and 730, Channel coding, rate matching, modulation, and so forth, is performed on the output from block 715 and on the output from blocks 720 to produce R-DCI0 and R-DCI1, respectively. In block 735, Resource Element (RE) mapping is performed along R-PDCCH0 and R-PDCCH1. In block 740, RS 105 uses RNTI0 and RNTI1 to determine R-PDCCH0 and R-PDCCH1 are assigned to RS 105.

In some embodiments, if multiple RNTIs are used for multiple HARQ processes, an RNTI set is sent to RS 105 through higher layer signaling. ES 102 sends the RNTI set, such as RNTI0 and RNTI1, to RS 105. The RNTI set can contain the exact number of RNTIs corresponding to the multiple HARQ processes, or the maximum possible number of RNTIs.

Figure 8:
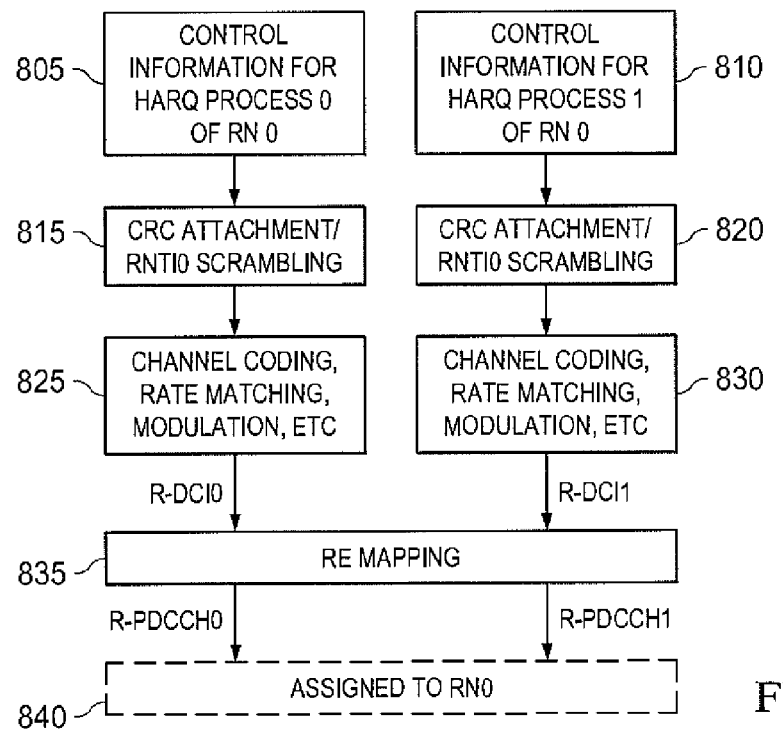
FIG. 8 illustrates two HARQ process assigned to one relay station with one RNTI according to embodiments of the present disclosure.

FIG. 8 illustrates two HARQ process assigned to one relay station with one RNTI according to embodiments of the present disclosure. The embodiment shown in FIG. 8 is for illustration only. Other embodiments could be used without departing from the scope of this disclosure.

One RNTI can be used for multiple HARQ processes. For example, block 705 includes control information for HARQ Process "0" for RS 105 and block 710 includes control information for HARQ Process "1" for RS 105. A DCI for the each HARQ process transmitted to RS 105 is attached with a CRC scrambled by the RNTI, as illustrated in blocks 815 and 820 below. In block 815, a CRC attachment and scrambling is performed using RNTI0. In block 820, a CRC attachment and scrambling is performed by the same RNTI0. In blocks 825 and 830, Channel coding, rate matching, modulation, and so forth, is performed on the output from block 815 and on the output from blocks 820 to produce R-DCI0 and R-DCI1, respectively. In block 835, Resource Element (RE) mapping is performed along R-PDCCH0 and R-PDCCH1. In block 840, R-PDCCH0 and R-PDCCH1 are assigned to RS 105. In this case, a DCI contains the HARQ process ID number field.

RS 105 can be configured to have a maximum number of HARQ processes. This configuration can be done through higher layer signaling by BS 102; or the maximum number can be fixed in the system, for example, the maximum number can be fixed to be "2."

RS 105 can use blind decoding to find multiple DCIs intended to itself. RS 105 de-scrambles the CRC attachment to the candidate DCIs with its RNTI. RS 105 stops the blind decoding if RS 105 either decodes the maximum number of DCIs successfully, or has exhaustively searched out the DCI candidates.

In some embodiments, multiple R-DCIs intended to RS 105 can be mapped to control channel elements (CCEs) independently without any pattern. In this case, RS 105 will blindly decode each R-PDCCH separately.

In some embodiments, multiple R-DCIs intended to RS 105 can be mapped to relay CCEs (R-CCEs) jointly. In this case, all the PDCCHs can be mapped to the same aggregation level or with a fixed pattern. When RS 105 correctly blindly decodes one DCI intended to RS 105, RS 105 knows the aggregation level or the exact location of the R-CCEs for the other R-DCIs (or R-PDCCHs). RS 105 can either blindly decode the other DCIs at the determined aggregation level, or attempt to find the other DCIs in the sets of R-CCEs that the pattern indicates.

Figure 9:
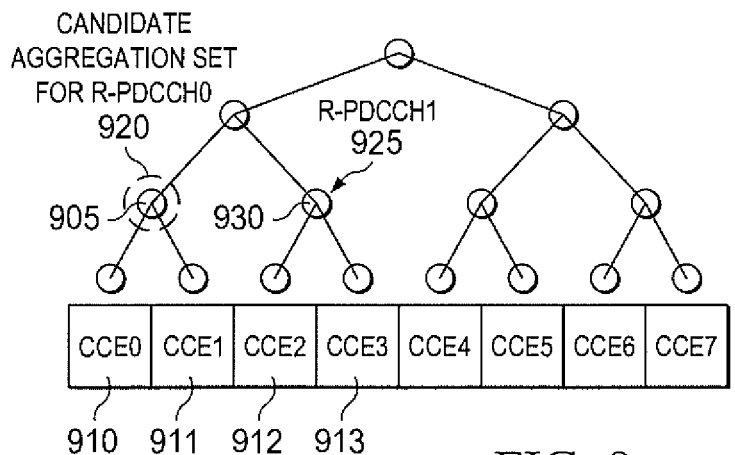
FIG. 9 illustrates blind decoding of two physical downlink control channels jointly mapped to control channel elements according to embodiments of the present disclosure.

FIG. 9 illustrates blind decoding by a relay station for two PDCCHs jointly mapped to CCEs according to embodiments of the present disclosure. The embodiment shown in FIG. 9 is for illustration only. Other embodiments could be used without departing from the scope of this disclosure.

In the tree diagram 900, a candidate R-PDCCH is found per node by aggregating the R-CCEs corresponding to the node's descendent leaf nodes. For example, R-PDCCH0 905 is found by aggregating R-CCE0 910 and R-CCE1 911.

In one example method, BS 102 maps two R-PDCCHs in the same aggregation level. In the example, if PDCCH0 905 is mapped to tree node "0" 920, R-PDCCH1 925 can be mapped to tree node "1" 930. Once RS 105 successfully decodes a DCI in R-PDCCH0 905, RS 105 determines that the other candidate R-PDCCH must be with 2-CCE aggregation. Then RS 105 continues blind decoding only with 2-CCE aggregation and find R-PDCCH1 925.

In another example method, BS 102 maps two R-PDCCHs in adjacent sets of R-CCEs in the same aggregation level. For example, when BS 102 maps R-PDCCH0 905 in the aggregation of R-CCE0 910 and R-CCE1 911, BS 102 maps R-PDCCH1 925 in the aggregation of R-CCE2 912 and R-CCE3 913.

Figure 10:
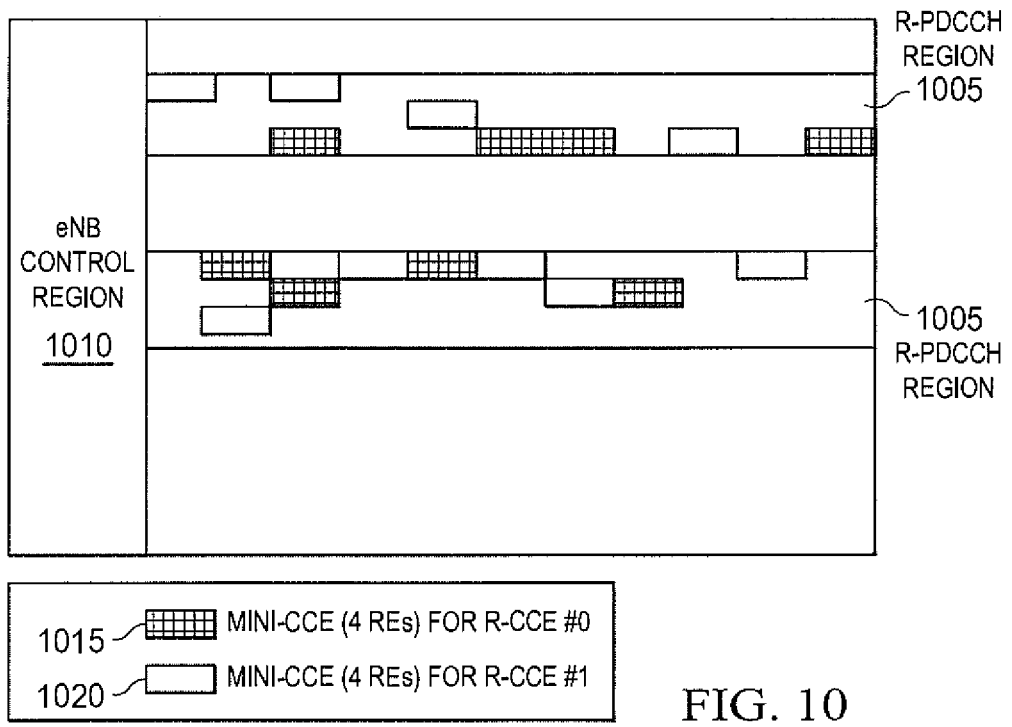
FIGS. 10 through 11B illustrate control channel element to resource element mapping according to embodiments of the present disclosure.

FIG. 10 illustrates CCE to RE mapping according to embodiments of the present disclosure. The embodiment shown in FIG. 10 is for illustration only. Other embodiments could be used without departing from the scope of this disclosure.

BS 102 semi-statically configures (by higher-layer signaling to relays) the R-PDCCH region 1005 as a set of REs in a number of REs in a subframe, excluding the REs used for BS 102 control region 1010 for macro subscriber stations, such as SS 111 and SS 116. An R-CCE is mapped onto a number of mini CCEs 1015, 1020, where each mini CCE is composed of four REs in the R-PDCCH region. For example, mini CCE 1015 corresponds to R-CCE#0 and mini CCE 1020 corresponds to R-CCE#1. An R-PDCCH is mapped to at least one R-CCE.

Figure 11A:
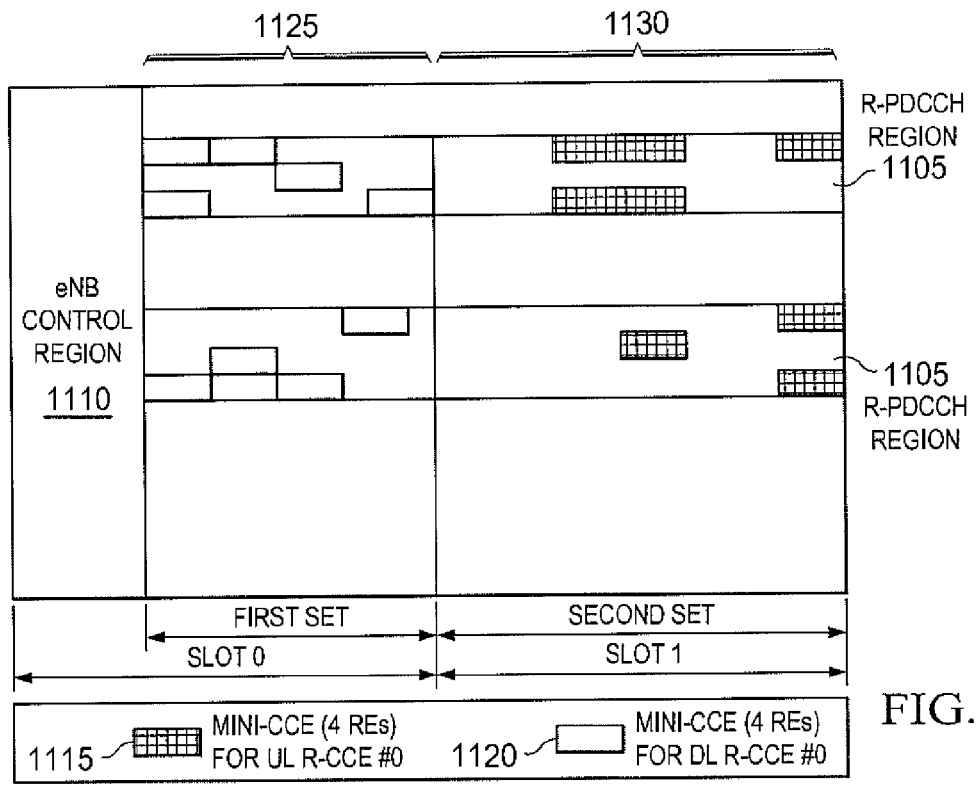
Figure 11B:
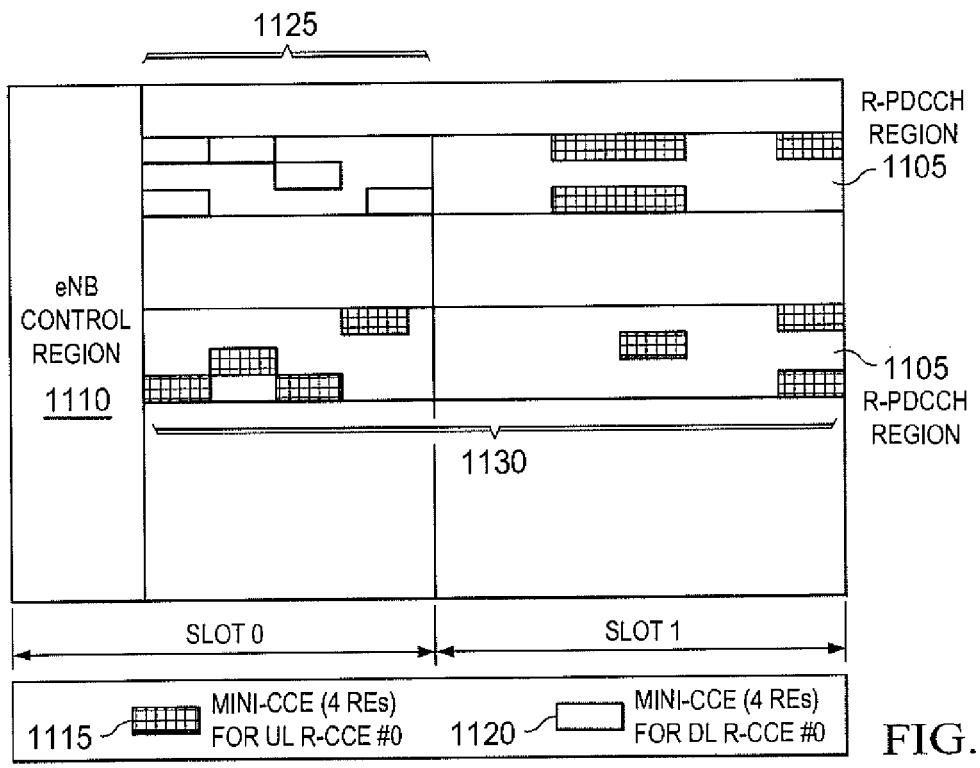

FIGS. 11A and 11B illustrate additional examples of CCE to RE mapping according to embodiments of the present disclosure. The embodiments shown in FIGS. 11A and 11B are for illustration only. Other embodiments could be used without departing from the scope of this disclosure.

In the example shown in FIG. 11A, BS 102 semi-statically configures the R-PDCCH region 1105 (by higher-layer signaling to relays) as a set of REs in a number of RBs in a subframe, excluding the REs used for eNodeB control region for macro subscriber stations, such as SS 111 and SS 116. Subframe 1110 is an exemplary one (1) millisecond subframe, where each subframe comprises two (2) slots, each equal to 0.5 milliseconds in duration. Subframe 1110 contains 14 sequential OFDM symbols, so that each slot contains 7 sequential OFDM symbols. However, this is by way of example only and should not be construed to limit the scope of the present disclosure. In alternate embodiments, the slots may be greater than or less than 0.5 milliseconds in duration and a subframe may contain more than or less than 14 OFDM symbols.

In addition, a first set 1125 of OFDM symbols in the R-PDCCH region 1105 are used for R-CCEs that are used for DL scheduling assignments (or downlink (DL) transmission grants), whereas a second set 1130 of OFDM symbols in the R-PDCCH region 1105 are used for R-CCEs that are used for UL scheduling assignments (or uplink (UL) transmission grants). BS 102 places DL grants in the first set of OFDM symbols in the R-PDCCH region since the LTE systems have a more stringent latency requirement for DL grants. The first set 1125 can correspond to the OFDM symbols in the first slot of a subframe, and the second set 1130 can corresponds to the OFDM symbols in the second slot of a subframe.

It is noted however, that the set boundary between set 1125 and set 1130 is not required to align with the slot boundary between slot 0 and slot 1. Thus, while there are seven (7) OFDM symbols in each for slot 0 and slot 1, there may be more than or less than 7 OFDM symbols in set 1125 and set 1130. An R-CCE is mapped onto a number of mini CCEs, where each mini CCE is composed of four REs in the R-PDCCH region 1105. A DL R-PDCCH is mapped to at least one R-CCE in the first slot. Similarly an UL R-PDCCH is mapped to at least one R-CCE in the second slot. For example, mini CCE 1115 corresponds to UL R-CCE#0 and mini CCE 1120 corresponds to DL R-CCE#0.

In some embodiments, as illustrated in FIG. 11A, the R-CCEs for the DL transmission grants are contained only in the first set 1125 of OFDM symbols and the R-CCEs for the UL transmission grants are contained only in the second 1130 of OFDM symbols, without overlap. However, in other embodiments, as illustrated in FIG. 11B, the R-CCEs for the UL transmission grants may be contained in both the first set 1125 of OFDM symbols and the second set 1130 of OFDM symbols An R-CCE is mapped onto a number of mini CCEs, where each mini CCE is composed of four REs in the R-PDCCH region 1105. A DL R-PDCCH is mapped to at least one R-CCE in the first slot; similarly an UL R-PDCCH is mapped to at least one R-CCE in both the first slot and the second slot. For example, mini CCE 1115 corresponds to UL R-CCE#0 and mini CCE 1120 corresponds to DL R-CCE#0

Figure 12:
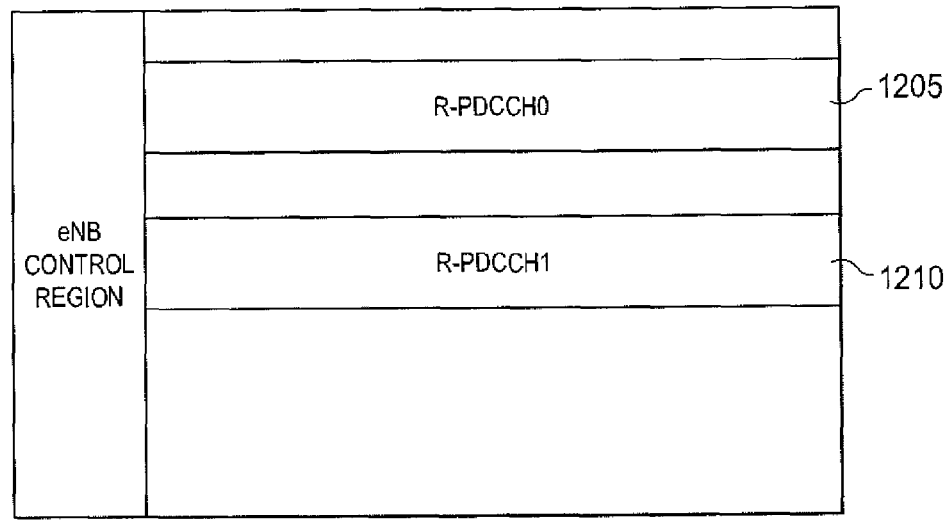
FIG. 12 illustrates two relay physical downlink control channels jointly allocated to resource blocks according to embodiments of the present disclosure.

FIG. 12 illustrates two relay physical downlink control channels jointly allocated to resource blocks according to embodiments of the present disclosure. The embodiment shown in FIG. 12 is for illustration only. Other embodiments could be used without departing from the scope of this disclosure.

In some embodiments, joint RE mapping can be associated with different HARQ processes. The joint RE mapping can be pre-determined or semi-statically configured. When RS 105 decodes the R-PDCCH0 1205, RS 105 also knows where to find R-PDCCH1 1210. In the example, R-PDCCHs 1205, 1210 are multiplexed using Frequency Division Multiplexing (FDM). The R-PDCCHs 1205, 1210 can also be multiplexed using Time Division Multiplexing (TDM), TDM/FDM, and the like.

Figure 13:
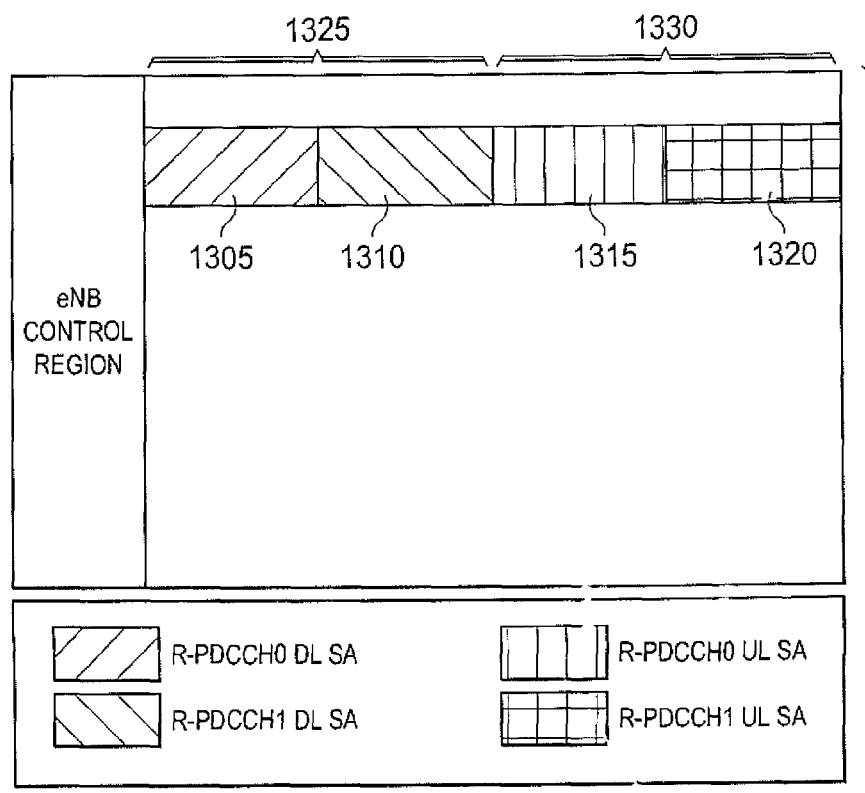
FIG. 13 illustrates two relay physical downlink control channels, associated with one relay station, multiplexed and mapped to one resource block according to embodiments of the present disclosure.

FIG. 13 illustrates two R-PDCCHs, associated with one relay station, such as RS 105, multiplexed and mapped to one RB according to embodiments of the present disclosure. The embodiment shown in FIG. 13 is for illustration only. Other embodiments could be used without departing from the scope of this disclosure.

In some embodiments, multiple R-PDCCHs associated with one relay station, such as RS 105, can be multiplexed and mapped to the pre-determined RBs. In particular, the DL scheduling allocation (SA) from different R-PDCCHs 1305, 1310 can be multiplexed and occupied the first slot 1325 or the first set of OFDM symbols in a subframe, and the UL SA from different R-PDCCHs 1315, 1320 will be multiplexed and occupied the second slot 1330 or the second set of OFDM symbols in a subframe. The RBs can be pre-determined such that RS 105 knows where to find its R-PDCCH.

Figure 1A:
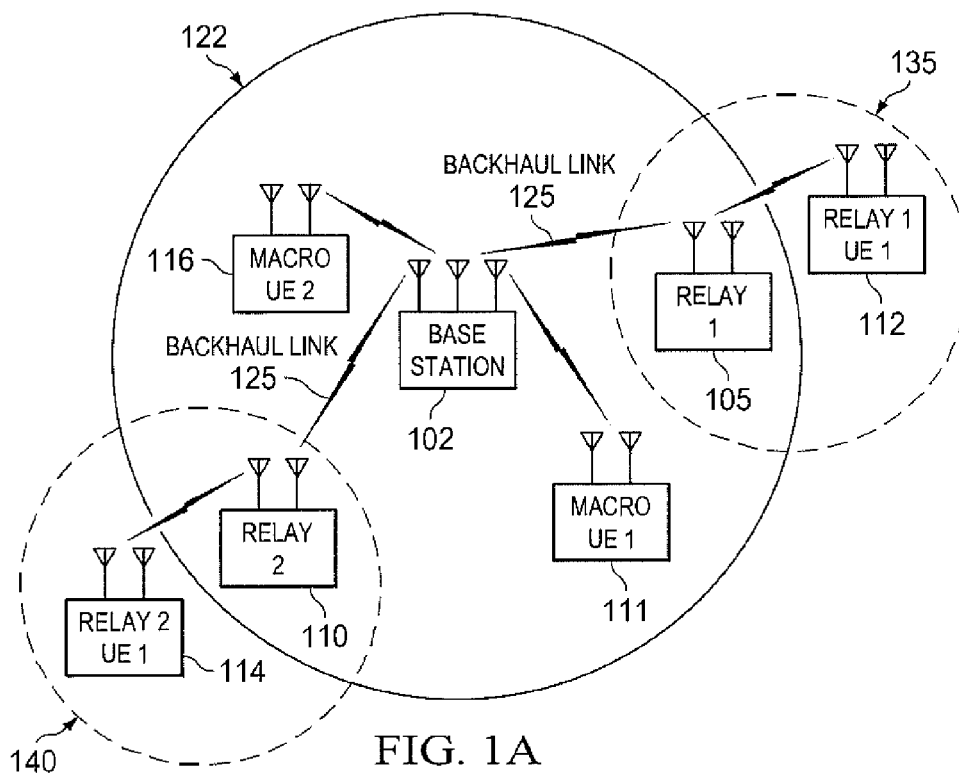
FIG. 1A illustrates a cellular system that includes relay stations according to the disclosure.
Figure 14:
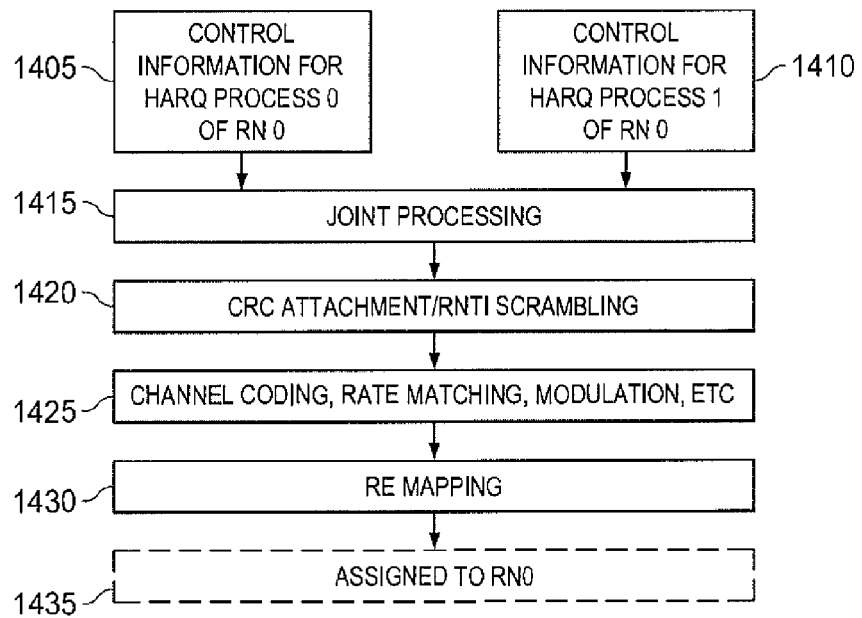
FIG. 14 illustrates two HARQ Processes assigned jointly to one relay station according to embodiments of the present disclosure.

FIG. 14 illustrates two HARQ Processes assigned jointly to one relay station according to embodiments of the present disclosure. The embodiment shown in FIG. 14 is for illustration only. Other embodiments could be used without departing from the scope of this disclosure.

In some embodiments, one R-PDCCH can be used to transmit multiple HARQ processes control information to one relay station, such as RS 105, in a subframe. Hereafter, the process of using one R-PDCCH to transmit multiple HARQ processes control information to one relay station, such as RS 105, is referred to as "Joint Processing." The control information for all the HARQ processes transmitted to RS 105 can be jointly processed and coded. Only one R-PDCCH is associated with all the HARQ processes. By decoding this R-PDCCH, RS 105 will get the control information for all the HARQ processes.

In some embodiments, mixed R-PDCCHs can be used to transmit multiple HARQ processes control information to a relay station, such as RS 105, in a subframe. One R-PDCCH can be used to transmit part of the multiple HARQ processes control information; another R-PDCCH can be used to transmit another part of the control information, and so forth. By decoding one R-PDCCH, RS 105 can get the control information for part of HARQ processes. All the embodiments related to separate R-PDCCHs can be also applied for mixed T-PDCCHs.

Two downlink grants can be jointly encoded such that two DCIs can be transmitted, using two respective HARQ process IDs, to RS 105. For example, block 1405 includes control information for HARQ Process "0" for RS 105 and block 1410 includes control information for HARQ Process "1" for RS 105. The two DCIs are jointly processed in block 1415. In block 1420, a CRC attachment and scrambling is performed using RNTI for RS 105. In blocks 1425, Channel coding, rate matching, modulation, and so forth, is performed on the output from block 1420. In block 1430, RE mapping is performed. In block 1435, RS 105 can determine its assignment.

A combination of multiple HARQ processes to one relay station, such as RS 105, transmitted in a subframe can be pre-determined or semi-statically configured. It is not necessary to send all the transmitted HARQ process numbers. With the combination known at by RS 105, only one or several HARQ process numbers is allowed. For example, two HARQ processes are transmitted RS 105. For the combination of HARQ process "0," only the combination HARQ process "0" and HARQ process "5" is allowed. Therefore, when RS 105 receives HARQ process "0", RS 105 knows another HARQ process is "5."

In some embodiments, for multiple HARQ processes, only one retransmission and one new transmission is allowed. The control information for retransmission and new transmission can be in certain (such as, specified or predetermined) order. For example, the retransmission control information is always transmitted first. All the retransmission related control information, for example, RV, NDI, and the like, can be removed for the new transmission.

In some embodiments, the multiple HARQ processes to one relay station, such as RS 105, can use the same MCS in block 1425. In current LTE specifications, if each HARQ process has one TB, five bits are used to specify the MCS scheme. HARQ process in spatial multiplexing can have two TBs. Thus, each TB will use five bits for MCS scheme. In some embodiments of the present disclosure, if multiple HARQ processes are transmitted to RS 105 in one subframe, only the MCS level for one HARQ process needs to be specified. Other HARQ processes can use the same MCS level as the one specified. No extra MCS bits are required for those other HARQ processes.

In some embodiments, the multiple HARQ processes to one relay station, such as RS 105, can share the same MIMO scheme and information. All the HARQ processes to RS 105 in a subframe will use the same MIMO scheme, the same codeword, and so forth.

In some embodiments, a transport block to codeword swap flag is shared by multiple HARQ processes if those HARQ processes are transmitted to one relay station, such as RS 105. All the HARQ processes to RS 105 in a subframe can use just one transport block to codeword swap flag.

Figure 15:
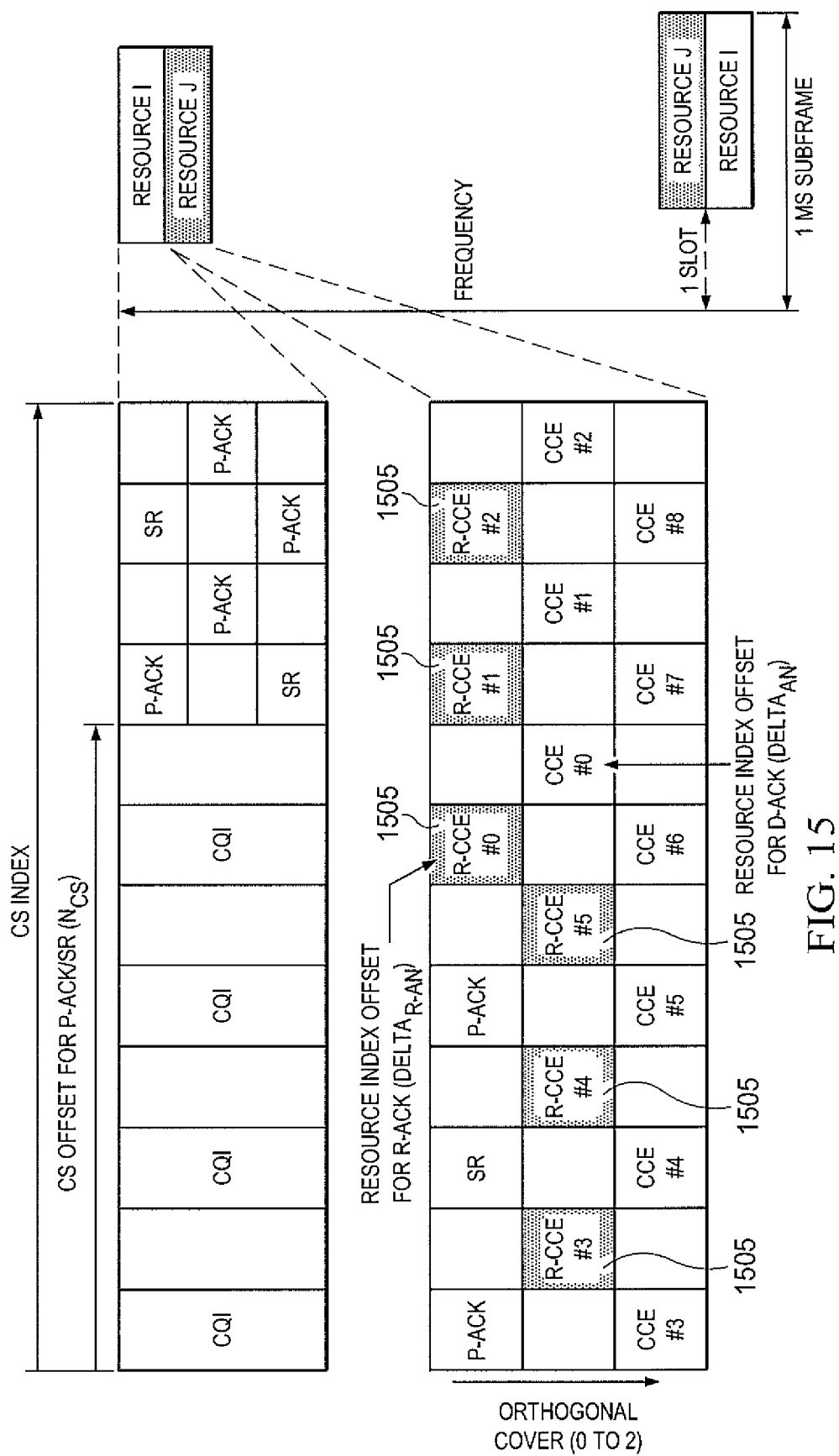
FIG. 15 illustrates an uplink bandwidth according to embodiments of the present disclosure.

FIG. 15 illustrates an uplink bandwidth according to embodiments of the present disclosure. The embodiment of the uplink bandwidth 1500 shown in FIG. 15 is for illustration only. Other embodiments could be used without departing from the scope of this disclosure.

The UL acknowledgement, in response to a DL transmission from BS 102 to RS 105, includes a relay-ACK (R-ACK) region 1505 in a subframe in between the persistent ACK/NACK and scheduling request region (P-ACK/SR) and the dynamic ACK/NACK region (D-ACK) in the UL bandwidth. A parameter $\text{Delta}_{R-AN}$ is defined such that the R-ACK region starts from the PUCCH resource indicated by the $\text{Delta}_{R-AN}$ parameter.

For a PDSCH transmission indicated by the detection of a corresponding R-PDCCH in subframe n-4, RS 105 can use PUCCH resource $n_{PUCCH}^{(R)} = n_{R-PDCCH} + N_{PUCCH}^{R}$ for transmission of HARQ-ACK in subframe n. Here, $n_{R-PDCCH}$ is the R-PDCCH resource index used for transmission of the corresponding DCI assignment and $N_{PUCCH}^{R}$ is configured by higher layers. In addition, $n_{PUCCH}^{(R)}$ can be mapped to physical resource just as $n_{PUCCH}^{(1)}$ in Section 5.4.1 in 36.211 v8.5.0, MAC Protocol Specification.

For example, the PDCCH resource index is $n_{R-CCE}$, where $n_{R-CCE}$ is the first CCE index used for transmission of the corresponding DCI assignment. In another example, the PDCCH resource index is the lowest index of RBs used for transmission of the corresponding DCI assignment.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A base station for use in a wireless communication network comprising a relay station capable of relaying communications between the base station and a subscriber station, the base station comprising:

a plurality of antennas; and
   a transmitter coupled to the plurality of antennas and configured to transmit a plurality of Orthogonal Frequency Division Multiplexing (OFDM) symbols in a plurality of resource blocks in two consecutive slots in a subframe, wherein a relay physical downlink control channel (R-PDCCH) region is semi statically configured by higher layer signaling as two sets of OFDM symbols in the subframe, such that a first of the two sets of OFDM symbols is configured for downlink scheduling assignments and a second of the two sets of OFDM symbols is configured for uplink scheduling assignments, wherein the second set of OFDM symbols configured for uplink scheduling assignments is contained in at least a second in time of the two consecutive slots.

2. The base station as set forth in claim 1, wherein the first and second sets of OFDM symbols are mutually exclusive.

3. The base station as set forth in claim 1, wherein at least some of the OFDM symbols in the second set are also in the first set.

4. The base station as set forth in claim 1, wherein the first set of OFDM symbols is contained in a first in time of the two consecutive slots.

5. The base station as set forth in claim 4, wherein the second set of OFDM symbols is contained in only the second slot.

6. The base station as set forth in claim 4, wherein the second set of OFDM symbols is contained in both the first and second slots.

7. The base station as set forth in claim 4, wherein a last OFDM symbol in the first set of OFDM symbols aligns with a boundary between the first slot and the second slot.

8. The base station as set forth in claim 4, wherein a last OFDM symbol in the first set of OFDM symbols does not align with a boundary between the first slot and the second slot.

9. A relay station capable of relaying communications between a base station and a subscriber station, the relay station comprising:
a transceiver configured to receive and transmit communications between a base station and at least one subscriber station; and
a controller configured to receive a plurality of Orthogonal Frequency Division Multiplexing (OFDM) symbols in a plurality of resource blocks in two consecutive slots in a subframe, wherein a relay physical downlink control channel (R-PDCCH) region is semi statically configured by higher layer signaling as two sets of OFDM symbols in the subframe, such that a first set of OFDM symbols is configured for downlink scheduling assignments and a second set of OFDM symbols is configured for uplink scheduling assignments, wherein the second set of OFDM symbols configured for uplink scheduling assignments is contained in at least a second in time of the two consecutive slots.

10. The relay station as set forth in claim 9, wherein the first and second sets of OFDM symbols are mutually exclusive.

11. The relay station as set forth in claim 9, wherein at least some of the OFDM symbols in the second set are also in the first set.

12. The relay station as set forth in claim 9, wherein the first set of OFDM symbols is contained in a first in time of the two consecutive slots.

13. The relay station as set forth in claim 12, wherein the second set of OFDM symbols is contained in only the second slot.

14. The relay station as set forth in claim 12, wherein the second set of OFDM symbols is contained in both the first and second slots.

15. The relay station as set forth in claim 12, wherein a last OFDM symbol in the first set of OFDM symbols aligns with a boundary between the first slot and the second slot.

16. The relay station as set forth in claim 12, wherein a last OFDM symbol in the first set of OFDM symbols does not align with a boundary between the first slot and the second slot.

17. For use in a wireless communication network, a method for operating a base station, the method comprising:
transmitting, from the base station to a relay station, a plurality of Orthogonal Frequency Division Multiplexing (OFDM) symbols in a plurality of resource blocks in two consecutive slots in a subframe; and
semi statically configuring a relay physical downlink control channel (R-PDCCH) region as two sets of OFDM symbols in the subframe, such that a first set of OFDM symbols is configured for downlink scheduling assignments and a second set of OFDM symbols is configured for uplink scheduling assignments, wherein the second set of OFDM symbols configured for uplink scheduling assignments is contained in at least a second in time of the two consecutive slots.

18. The method as set forth in claim 17, wherein the first and second sets of OFDM symbols are mutually exclusive.

19. The method as set forth in claim 17, wherein at least some of the OFDM symbols in the second set are also in the first set.

20. The method as set forth in claim 17, wherein the first set of OFDM symbols is contained in a first in time of the two consecutive slots.

21. The method as set forth in claim 20, wherein the second set of OFDM symbols is contained in only the second slot.

22. The method as set forth in claim 20, wherein the second set of OFDM symbols is contained in both the first and second slots.

23. The method as set forth in claim 20, wherein a last OFDM symbol in the first set of OFDM symbols aligns with a boundary between the first slot and the second slot.

24. The method as set forth in claim 20, wherein a last OFDM symbol in the first set of OFDM symbols does not align with a boundary between the first slot and the second slot.

25. For use in a wireless communication network, a method for operating a relay station, the method comprising:
receiving, from the base station, a plurality of Orthogonal Frequency Division Multiplexing (OFDM) symbols in a plurality of resource blocks in two consecutive slots in a subframe, wherein a relay physical downlink control channel (R-PDCCH) region is semi statically configured by higher layer signaling as two sets of OFDM symbols in the subframe, such that a first set of OFDM symbols is configured for downlink scheduling assignments and a second set of OFDM symbols is configured for uplink scheduling assignments, wherein the second set of OFDM symbols configured for uplink scheduling assignments is contained in at least a second in time of the two consecutive slots.

26. The method as set forth in claim 25, wherein the first and second sets of OFDM symbols are mutually exclusive.

27. The method as set forth in claim 25, wherein at least some of the OFDM symbols in the second set are also in the first set.

28. The method as set forth in claim 25, wherein the first set of OFDM symbols is contained in a first in time of the two consecutive slots.

29. The method as set forth in claim 28, wherein the second set of OFDM symbols is contained in only the second slot.

30. The method as set forth in claim 28, wherein the second set of OFDM symbols is contained in both the first and second slots.

31. The method as set forth in claim 28, wherein a last OFDM symbol in the first set of OFDM symbols aligns with a boundary between the first slot and the second slot.

32. The method as set forth in claim 28, wherein a last OFDM symbol in the first set of OFDM symbols does not align with a boundary between the first slot and the second slot.

* * * * *